United States Patent [19]

Porco

[11] Patent Number: 4,873,712
[45] Date of Patent: Oct. 10, 1989

[54] TELEPHONE CONTROLLED INTERRUPTER CIRCUIT

[75] Inventor: Carmen R. Porco, Canoga Park, Calif.

[73] Assignee: Alliance Research Corporation, Chatsworth, Calif.

[21] Appl. No.: 196,954

[22] Filed: May 19, 1988

[51] Int. Cl.$^4$ ...................... H04Q 7/04; H04M 11/00
[52] U.S. Cl. ...................................... 379/58; 379/441; 455/88
[58] Field of Search .................. 379/58, 59, 105, 110, 379/441; 455/88

[56] References Cited

U.S. PATENT DOCUMENTS

| | | | |
|---|---|---|---|
| 1,909,843 | 5/1933 | Squire | 379/421 |
| 3,868,571 | 2/1975 | Greiner | 455/88 |
| 3,971,985 | 7/1976 | Arai | 455/88 |
| 4,027,249 | 5/1977 | Calman | 455/88 |
| 4,389,543 | 6/1983 | Granier et al. | 379/378 |
| 4,524,461 | 6/1985 | Kostanty et al. | 455/88 X |
| 4,591,661 | 5/1986 | Benedetto et al. | 379/61 |

FOREIGN PATENT DOCUMENTS 59-36438  2/1984  Japan ...................................... 379/58

OTHER PUBLICATIONS

*Installation News*, Apr., 1988, pp. 40–41, "Device Adds Profit to Cellular Installs, Turns Off Radio for Incoming, Outgoing Calls".

*Primary Examiner*—Keith E. George
*Attorney, Agent, or Firm*—Kleinberg, Marvin H.; Matthew F. Jodziewicz

[57] ABSTRACT

A control unit is inserted in the power lines that serve a vehicular telephone and an audio system. A power monitoring circuit detects current increases related to operation of the telephone, either from an incoming "ring" signal or the "off hook" condition in preparation for an outgoing call. The monitoring circuit generates a control signal which is applied to an electronic switching circuit that interrupts the flow of power to the audio system circuits. So long as the telephone is in use, the audio system is disabled. When the telephone returns to the quiescent or stand-by state, the current drawn by the telephone drops substantially below a threshold level of the monitoring circuit and the switching circuit restores the power to the audio system.

4 Claims, 2 Drawing Sheets

TELEPHONE CONTROLLED INTERRUPTER CIRCUIT

FIELD OF THE INVENTION

The present invention relates generally to control circuits and, more particularly, to a circuit that monitors a the power line of a primary accessory such as a telephone and, in response to the detection of power usage, disables an associated secondary accessory, such as an audio system whose concurrent operation would be interfering and distracting.

REFERENCE TO RELATED APPLICATIONS

Description of Prior Art

It will be obvious that it is difficult to engage in a telephone conversation in the presence of an operating audio system at normal volume levels. The problem is exacerbated in the confined quarters of an automobile which is equipped with a cellular telephone and an audio system. Usually, the sound levels of an automotive audio system are maintained at a relatively high level so that program material can be heard over the noise of automobile operation, traffic, wind, and other automotive accessories such as air conditioning units. All contribute to a high ambient sound level within the automobile interior.

When considering these various sources of noise, probably the most troublesome is the audio system since it competes directly with the operation of the telephone. The sounds coming from the speakers compete directly with any ringing signal associated with an incoming call and the incoming conversational speech that must be heard through the telephone equipment. Normally, when placing or receiving a telephone call, the audio system is either turned off or its volume levels are substantially reduced. This, in the environment of an automobile, requires some manipulation of the audio system controls at a time when the vehicle operator is occupied not only with the operation of the vehicle but with the telephone, as well.

Because the automotive telephone is a fairly recent innovation, the prior art has not really come to grips with the problem except in the case of systems which combined the audio and telephone functions in a single apparatus, such as is shown in the patent to Benedetto, et al, U.S. Pat. No. 4,591,661. In that patent, a combined radio and telephone used an electronic "latch" to disable or "squelch" the audio circuits when a "ringing" signal was received on the telephone circuits. A "talk" switch enables a telephone conversation to proceed and generated a reset signal for the "latch" when the conversation was terminated. Resetting the "latch" then re-enabled the audio circuits.

Earlier patents such as U.S. Pat. No. 3,971,985 disclosed a squelch control for a transceiver and radio or tape recorder which was operative so long as a transceiver signal was present.

This approach, too, required a transceiver which was combined with an audio system.

What has been lacking in the prior art and what is needed, especially in the environment of the modern automobile equipped with independent cellular telephone and audio systems, is an interrupter unit that need not have access to the internal circuits or switches of either system.

List of Objectives

It is therefore a primary objective of the present invention to provide a telephone controlled audio system interrupter circuit that operates externally of the telephone and audio systems.

Another objective of the present invention is to to provide a simple audio interrupter circuit that can be interposed between the source of power and the telephone and audio systems.

Another objective of the present invention is to furnish an audio interrupt circuit that can be located away from the circuits being controlled or monitored.

Another objective of the present invention is to provide a simple circuit that responds to an increase in current being drawn by the telephone circuits to open an electronic switch for cutting power to audio circuits.

Another objective of the present invention is to provide a power interrupting circuit that is controlled by detecting power levels in a telephone circuit but whose sensitivity can be adjusted to prevent "false" triggering on currents less than that drawn by either the ringing signal or the communication circuits in use.

SUMMARY OF THE PREFERRED EMBODIMENT

Briefly, a preferred embodiment of the present invention includes a control unit that is inserted into the power lines that serve the telephone system and the audio system. A monitoring circuit detects an increase in the current being drawn by the telephone circuit, resulting from a "ring" signal or when the telephone goes "off hook" in preparation for placing a call.

The monitoring circuit then drives an electronic switching circuit that interrupts the flow of power to the audio circuits. So long as the increased current is detected in the telephone power circuit, the audio circuits are kept disabled. When the telephone returns to the quiescent or stand-by state, the current drawn by the telephone circuits drops substantially below the threshold that is detected by the monitoring circuit and power is restored to the audio circuits.

List of Advantages of the Invention

These and other objects and advantages of the present invention will no doubt become apparent to those skilled in the art after having read the following detailed description of the preferred embodiment which are contained in and illustrated by the various drawing figures.

DETAILED DESCRIPTION OF THE PREFERRED EMBODIMENT

Figure 1:
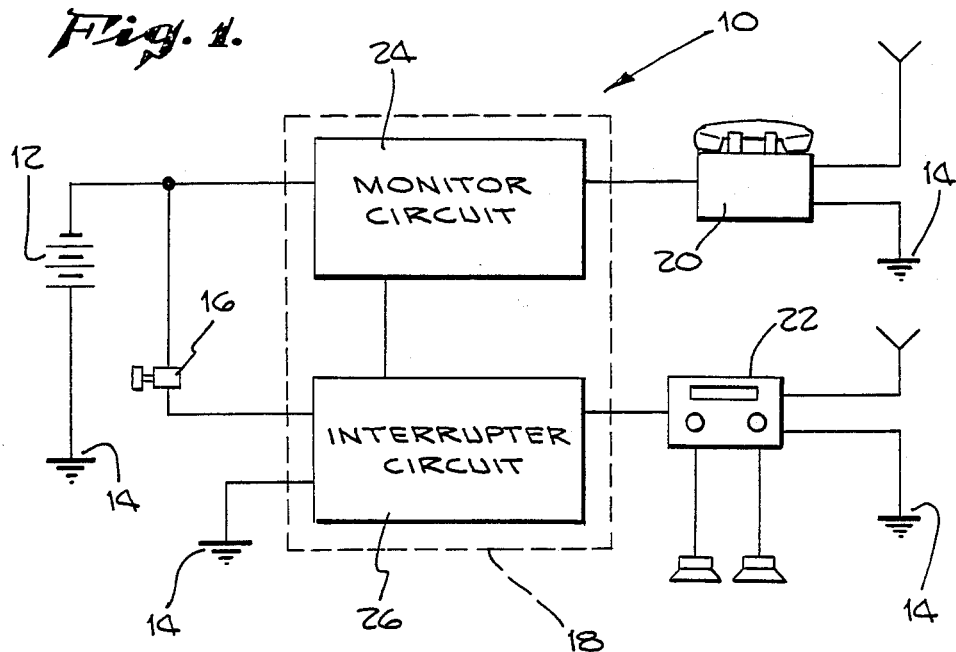
FIG. 1 is a generalized block diagram of an automotive electrical system including a telephone controlled interrupter circuit according to the present invention.

Turning first to FIG. 1, there is shown a generalized diagram of an automotive electrical system 10 such as is found in a typical automobile.

The electrical system 10 includes the battery 12 which has one of its terminals connected to source of common reference potential 14. The other terminal of battery 12 provides unswitched power to the automobile and its accessory systems.

The unswitched power line from battery 12 is connected to an input terminal of ignition switch 16. The ignition switch 16 then becomes a source of switched power for those accessories and systems which should be disabled when the ignition switch 16 is off.

The unswitched power line from the battery 12 is applied to the unswitched power input terminal of the monitor and interrupter circuit 18. The switched power output of the ignition switch 16 is applied to a switched power input terminal of the monitor and interrupter circuit 18.

The unswitched power output terminal of the monitor and interrupter circuit 18 is connected to furnish power to a primary accessory such as the cellular telephone 20, and the switched power output terminal of the monitor and interrupter circuit 18 is connected to provide power to a secondary accessory such as the audio system 22.

The cellular telephone 20 and audio system 22 are independent accessories which preferably should not be in use concurrently. However, the audio system 22 is generally in operation whenever the vehicle is occupied while the cellular telephone 20 should be ready to accept incoming calls at all times.

As seen, the battery 12 is the basic source of power for the electrical system 10. Since there are some operating and accessory systems that should be operable at all times, a direct source of battery power is made available. Clearly, there is an advantage in having the cellular telephone 20 powered at all times so that the phone can be utilized to make and receive calls whether or not the vehicle is in operation.

Although the preferred embodiment shows the audio system 22 receiving switched power from the interrupter circuit 18, some prefer that the audio system 22 be powered at all times, as well, so that particular programs or selections not be interrupted when the engine is stopped.

Figure 2:
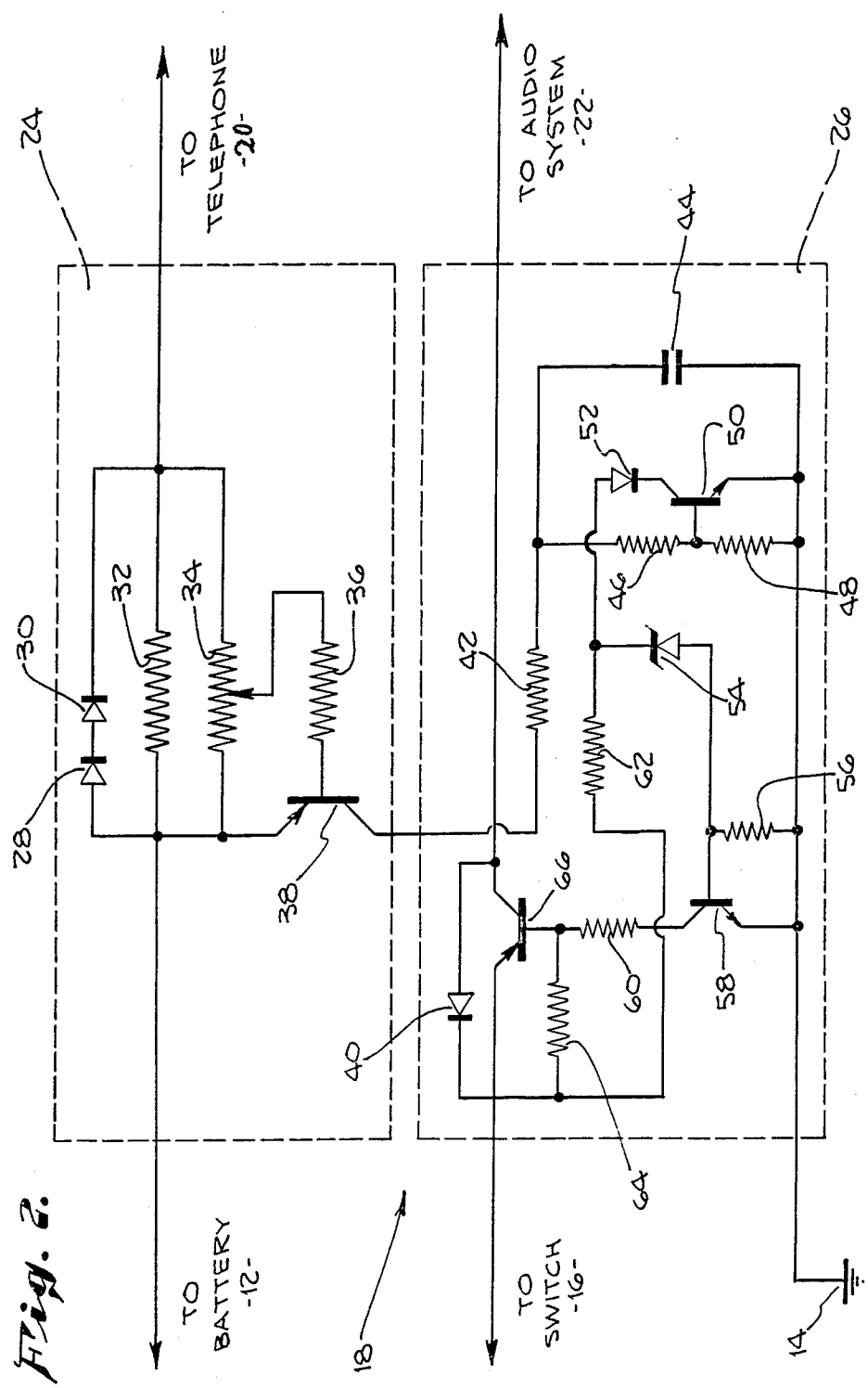
FIG. 2 is a circuit diagram of a preferred embodiment of the monitor and interrupter circuits 18 of FIG. 1 according to the present invention.

Turning now to FIG. 2, there is shown a circuit diagram of the monitor and interrupter circuit 18 of FIG. 1. The monitor and interrupter circuit 18 is made up of two cooperating circuits, a monitor circuit 24 and an interrupter circuit 26. The monitor circuit 24 is configured to transmit power to the cellular telephone 20 of FIG. 1, above, while the interrupter circuit 26 supplies power to the audio system 22. The monitor circuit 24 monitors the flow of current that is supplied to the cellular telephone 20 and when that current flow exceeds a predetermined threshold amount, a control signal is applied to the interrupter circuit 26.

The control signal from the monitor circuit 24 is applied to the circuits of interrupter circuit 26 and activate an electronic switch which effectively disconnects the audio system 22 from the source of power. When the control signal from monitor circuit 24 is removed, the power to the audio system 22 is restored.

The monitor circuit 24 includes an input terminal which is connected to the battery 12. A parallel circuit having three branches terminates at a telephone power output terminal which is connected to the cellular telephone 20. A first branch of the parallel circuit includes the first diode 28 and second diode 30. To protect the diodes 28, 30, a primary resistor 32 is provided which has a sufficiently low resistance to carry most of the current load should the resistance of the diode branch increase for any reason.

The third parallel branch contains a tapped potentiometer 34 which supplies a base bias current through a first base resistor 36 to the base of a monitor transistor 38. The collector output of the monitor transistor 38 controls the operation of the interrupter circuit 26 in a manner to be described below.

The primary function of interrupter circuit 26 is to supply power to the audio system 22. A third diode 40 protects the current interrupter element. The control portion of the interrupt circuit 26 receives the output of the monitor transistor 38 at a first bias resistor 42 which is connected to the parallel combination of a timing capacitor 44 and first and second base bias resistors 46, 48, both branches of which connect to the source of common potential 14. The junction of the first and second base bias resistors 46, 48 is connected to the base of a second transistor 50 which applies its output to a threshold indicator diode 52. Connected to the threshold indicator diode 52 is a zener diode 54 which connects, through a third base bias resistor 56, to the source of common reference potential 14. The second base bias resistor 48 and the emitter of the second transistor 50 are also connected to the common reference source 14.

The junction of the zener diode 54 and the third base bias resistor 56 is connected to the base of a third transistor 58. The collector of third transistor 58 is connected to a fourth base bias resistor 60. The threshold indicator diode 52 and the zener diode 54 are tied to one end of a second bias resistor 62 which is connected to a further base bias resistor 64 to drive the base of a switching transistor 66.

The collector of the switching transistor 66 is tied through the third diode 40 the further bias resistor 64 and also connects to the output terminal that supplies the power to the audio system 22.

When the cellular telephone 20 is in quiescent operation, very little current is drawn and the voltage across the parallel circuit of the diodes 28, 30, the resistor 32 and the potentiometer 34 is substantially the input voltage. Accordingly, the voltage applied to the base of the monitor transistor 38 is also the input voltage which is sufficient to drive the monitor transistor 38 "off".

Once the cellular telephone 20 becomes active, either by receiving a "ring" signal or by going "off hook" preparatory to placing a call, the cellular telephone 20 will draw substantial current through the parallel circuit and there will be a voltage drop across it. The voltage appearing at the tap of the tapped potentiometer 34 will be sufficiently low so that when applied to the base of the monitor transistor 3, the monitor transistor 38 will conduct, raising the potential which is applied as a control signal to the monitor circuit 24.

The adjustable tap of the tapped potentiometer 34 can be set to provide the proper voltage levels to the base of the monitor transistor 38 such that the transistor 38 is on only during the provision of operating levels of power to the cellular telephone 20.

With the monitor transistor 38 "off", the voltage applied to the bias resistor 42 is substantially the voltage for the common source 14 and the bias applied to the base of the second transistor 50 is low enough to keep the transistor out of conduction. Accordingly, the voltage at the zener diode 54 is substantially that at the switch 16 output and the base of the third transistor 58 is held at relatively high voltage, ensuring conduction.

With the third transistor 58 in conduction, an intermediate voltage is created at the base of the switching transistor 66 by the voltage divider circuit of the fourth base bias resistor 60 and the further base bias resistor 64 sufficient to maintain the switching transistor 66 in the "on" condition.

If the telephone circuit 20 now becomes active and begins to draw current, the voltage will drop across the parallel circuit and the voltage at the tap of the potentiometer 34 will be at a sufficiently low level to bias the monitor transistor 38 into conduction, raising the potential at the first bias resistor 42. The parallel timing capacitor 44 imposes a slight delay before the potential at the voltage divider circuit comprised of the first and second base bias resistors 46, 48 rises to a point sufficient to begin conduction in the second transistor 50.

With the second transistor 50 in conduction, the voltage at the zener diode 54 drops to to a level comparable to that of the common reference. The bias at the base of the third transistor 58 then drops, causing the third transistor 58 to turn "off", thereby raising the potential at the base of the switching transistor 66, and driving it out of conduction, as well. As the switching transistor 66 no longer conducts, the power to the audio system 22 is interrupted, silencing the audio system 22 during operation of the telephone 20.

Figure 3:
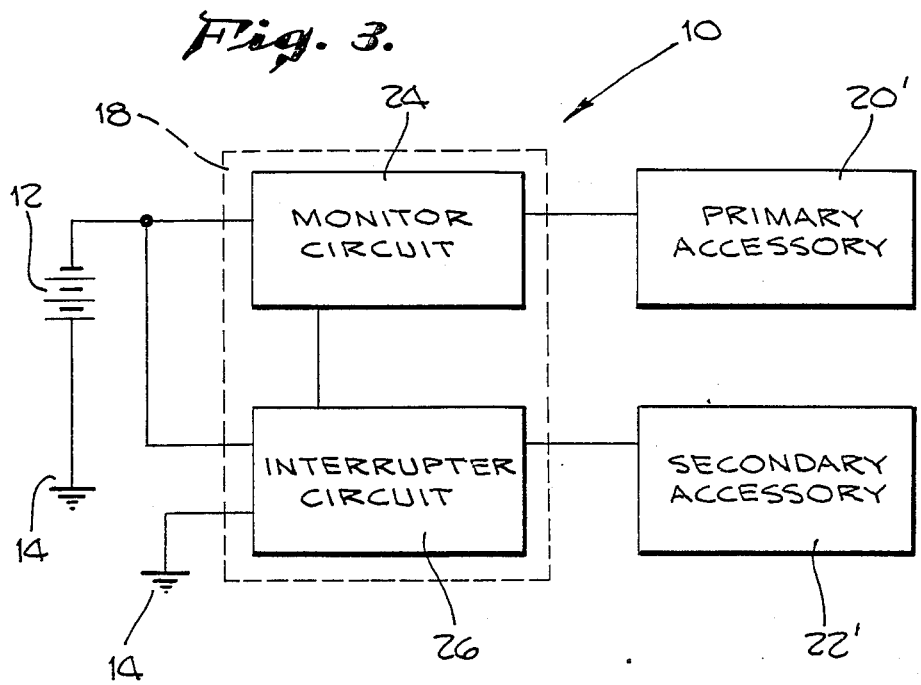
FIG. 3 is block diagram of an alternative embodiment of the interrupter circuit of FIG. 1 in which both the telephone and audio systems are connected to an unswitched source of power.

The system illustrated in FIG. 3 is substantially identical to that shown in FIG. 1, differing only in that both the primary accessory 20'1 cellular telephone 20, and the secondary accessory audio system 22, 22'1 are powered from an unswitched source.

Although the present invention has been described in terms of specific embodiments, it is anticipated that alterations and modifications thereof will no doubt become apparent to those skilled in the art. It is intended that the following claims be interpreted as covering all such alterations and modifications as fall within the true spirit and scope of the invention.

What is claimed is:

1. In a vehicle equipped with a telephone, an audio system and a battery for powering the telephone and audio system, a circuit for interrupting the flow of power to the audio system in response to the activation of the telephone comprising, in combination;
   monitor circuit means interposed between the battery and the telephone including first means for creating a first signal in response to a flow of power to the the telephone in excess of a predetermined power threshold and a second signal in response to a flow of power below said threshold; and
   circuit interrupter means connected to said monitor circuit means and interposed between the battery and the audio system, said circuit interrupter means including switching means responsive to said first signal for disconnecting the audio system from the battery and responsive to said second signal for connecting the audio system to the battery,
   whereby the audio system is disabled whenever the telephone operates and draws power in excess of the predetermined power threshold level.

2. Apparatus as in claim 1, above, wherein said first means comprises current detector means determining the power flow to the telephone.

3. Apparatus as in claim 2, above, wherein said current detector means includes an adjustable potentiometer for selecting threshold current values.

4. Apparatus as in claim 3, above, wherein said monitor circuit includes a circuit element coupled to said adjustable potentiometer and operable in response to voltage values therefrom for generating said first and second signals which are applied to said controller circuit.

* * * * *